United States Patent
Sabathil et al.

(10) Patent No.: US 8,969,900 B2
(45) Date of Patent: Mar. 3, 2015

(54) OPTOELECTRONIC SEMICONDUCTOR CHIP AND METHOD FOR THE PRODUCTION THEREOF

(75) Inventors: Matthias Sabathil, Regensburg (DE);
Alexander Linkov, Regensburg (DE);
Christopher Kölper, Regensburg (DE);
Martin Straßburg, Donaustauf (DE);
Norwin von Malm, Nittendorf (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/883,346

(22) PCT Filed: Nov. 2, 2011

(86) PCT No.: PCT/EP2011/069247
§ 371 (c)(1),
(2), (4) Date: Jun. 13, 2013

(87) PCT Pub. No.: WO2012/062635
PCT Pub. Date: May 18, 2012

(65) Prior Publication Data
US 2013/0328066 A1 Dec. 12, 2013

(30) Foreign Application Priority Data
Nov. 12, 2010 (DE) .......... 10 2010 051 286

(51) Int. Cl.
*H01L 29/22* (2006.01)
*H01L 33/02* (2010.01)
(Continued)

(52) U.S. Cl.
CPC .......... *H01L 33/02* (2013.01); *H01L 33/20* (2013.01); *H01L 33/508* (2013.01); *H01L 33/08* (2013.01); *H01L 33/24* (2013.01); *H01L 2933/0041* (2013.01); *B82Y 40/00* (2013.01)

USPC .......... 257/98; 257/79; 257/95; 257/E33.067; 257/E33.068

(58) Field of Classification Search
USPC .......... 257/79, 95, 98, E33.055, E33.067, 257/E33.068
See application file for complete search history.

(56) References Cited

U.S. PATENT DOCUMENTS

| 6,066,861 A | 5/2000 | Höhn et al. |
| 8,178,384 B1 * | 5/2012 | Roscheisen et al. ............ 438/82 |

(Continued)

FOREIGN PATENT DOCUMENTS

| DE | 196 38 667 A1 | 4/1998 |
| DE | 10 2007 003 785 A1 | 7/2008 |

(Continued)

OTHER PUBLICATIONS

English translation of the Japanese Notice of Reasons for Rejection dispatched Apr. 15, 2014 from corresponding Japanese Patent Application No. 2013-538131.

(Continued)

*Primary Examiner* — Matthew E Warren
(74) *Attorney, Agent, or Firm* — DLA Piper LLP (US)

(57) ABSTRACT

An optoelectronic semiconductor chip includes a semiconductor layer stack having an active layer that generates radiation, and a radiation emission side, and a conversion layer disposed on the radiation emission side of the semiconductor layer stack, wherein the conversion layer converts at least a portion of the radiation, which is emitted by the active layer, into radiation of a different wavelength, the radiation emission side of the semiconductor layer stack has a first nanostructuring, and the conversion layer is disposed in this first nanostructuring.

18 Claims, 5 Drawing Sheets

(51) Int. Cl.
  *H01L 33/20* (2010.01)
  *H01L 33/50* (2010.01)
  *H01L 33/08* (2010.01)
  *H01L 33/24* (2010.01)
  *B82Y 40/00* (2011.01)

(56) References Cited

U.S. PATENT DOCUMENTS

| | | | |
|---|---|---|---|
| 8,330,173 B2* | 12/2012 | Kim | 257/93 |
| 2004/0178417 A1 | 9/2004 | Andrews | |
| 2006/0192225 A1 | 8/2006 | Chua et al. | |
| 2007/0085100 A1 | 4/2007 | Diana et al. | |
| 2007/0228931 A1 | 10/2007 | Kim et al. | |
| 2008/0142823 A1* | 6/2008 | Moon et al. | 257/98 |
| 2008/0284313 A1 | 11/2008 | Berben et al. | |
| 2009/0039365 A1 | 2/2009 | Andrews et al. | |
| 2009/0091258 A1 | 4/2009 | Heuser et al. | |
| 2010/0038665 A1 | 2/2010 | Sugiura et al. | |
| 2010/0133562 A1 | 6/2010 | Zhang et al. | |
| 2010/0176411 A1 | 7/2010 | Suzuki | |
| 2012/0161185 A1* | 6/2012 | Wang | 257/98 |
| 2012/0224148 A1* | 9/2012 | Natsumeda et al. | 353/20 |

FOREIGN PATENT DOCUMENTS

| | | |
|---|---|---|
| DE | 10 2008 022 542 A1 | 11/2009 |
| JP | 2003-243726 | 8/2003 |
| JP | 2006-332650 | 12/2006 |
| KR | 10-0746784 | 7/2007 |
| WO | 2008/086855 A1 | 7/2008 |

OTHER PUBLICATIONS

English translation of Korean Examination Report dated May 29, 2014 from corresponding Korean Patent Application No. 10-2013-7013281.

* cited by examiner

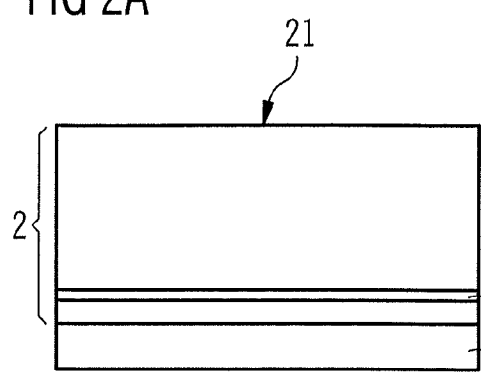
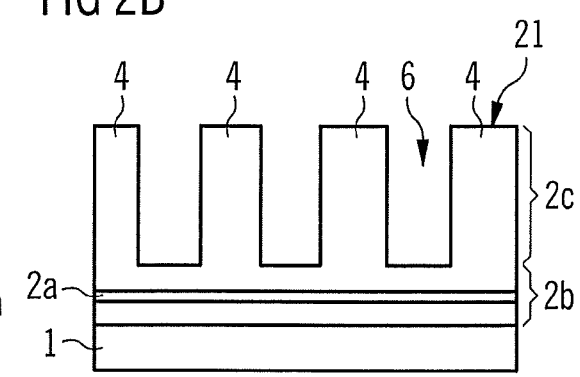
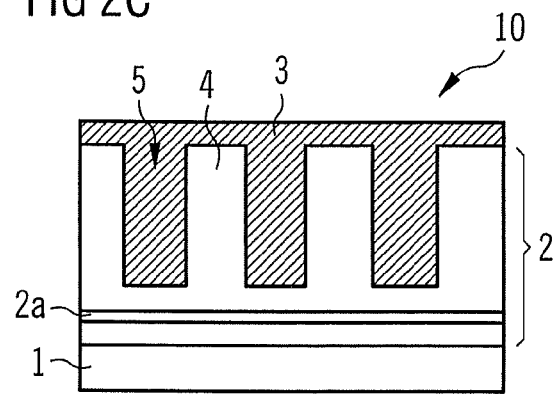

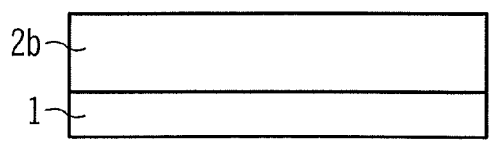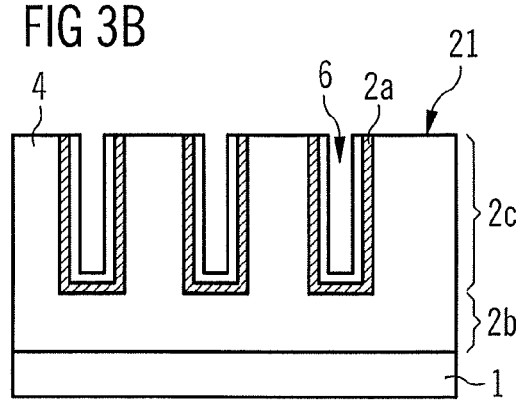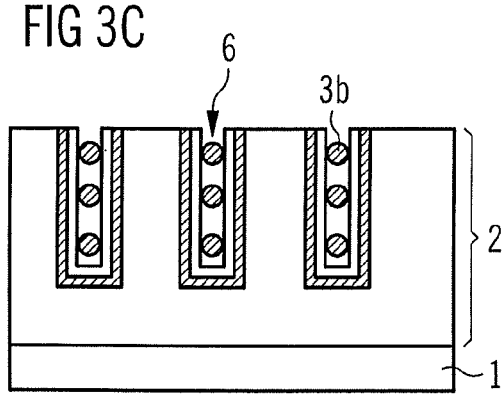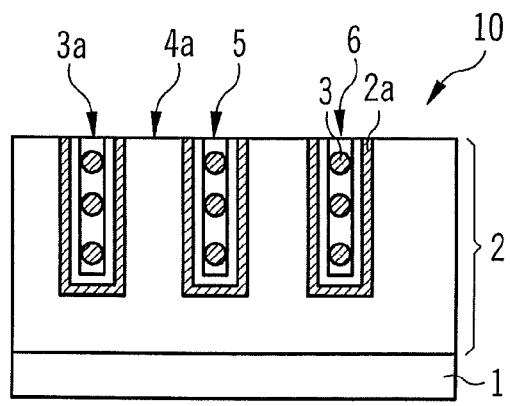

OPTOELECTRONIC SEMICONDUCTOR CHIP AND METHOD FOR THE PRODUCTION THEREOF

TECHNICAL FIELD

This disclosure relates to an optoelectronic semiconductor chip having a semiconductor layer stack and a conversion layer, and to a method for the production thereof.

BACKGROUND

Semiconductor chips having conversion layers disposed thereon are known, wherein in the case of the conventional semiconductor chips, the conversion layer mostly has a lower refractive index than the layers of the semiconductor layer stack. For example, the conventional conversion layer is composed of a matrix material, e.g., silicone or resin, and a conversion element disposed therein. The conversion layer is applied, e.g., as a separate layer onto the semiconductor chip or disposed as a volume filler around the semiconductor chip. Alternatively, it is known to adhere ceramic phosphorous platelets onto the semiconductor chip by means of, e.g., a silicone adhesive.

However, conversion layers of this type can have disadvantageously high losses on account of scattered and converted light not completely reflected by a housing or the semiconductor chip itself. Furthermore, the thermal bonding of the conversion layer to the semiconductor chip by a material such as, e.g., resin or silicone, is not optimum, which means that additional efficiency losses can occur. Moreover, efficiency losses can occur by reason of ageing effects such as, e.g., crack formation in the matrix material.

It could therefore be helpful to provide a semiconductor chip in which a conversion layer is coupled in an optically and thermally improved manner to the semiconductor chip and at the same time the semiconductor chip has an increase in the efficiency of the coupling-out of radiation. It could also be helpful to provide a method for the production of such a semiconductor chip.

SUMMARY

We provide an optoelectronic semiconductor chip including a semiconductor layer stack having an active layer that generates radiation, and a radiation emission side, and a conversion layer disposed on the radiation emission side of the semiconductor layer stack, wherein the conversion layer converts at least a portion of the radiation, which is emitted by the active layer, into radiation of a different wavelength, the radiation emission side of the semiconductor layer stack has a first nanostructuring, and the conversion layer is disposed in the first nanostructuring.

We also provide a method of producing the semiconductor chip including a semiconductor layer stack having an active layer that generates radiation, and a radiation emission side, and a conversion layer disposed on the radiation emission side of the semiconductor layer stack, wherein the conversion layer converts at least a portion of the radiation, which is emitted by the active layer, into radiation of a different wavelength, the radiation emission side of the semiconductor layer stack has a first nanostructuring, and the conversion layer is disposed in the first nanostructuring, including providing a growth substrate, growing a semiconductor layer stack onto the growth substrate which includes an active layer and a radiation emission side, forming a first nanostructuring on the radiation emission side, and introducing a conversion layer into the first nanostructuring.

We further provide an optoelectronic semiconductor chip including a semiconductor layer stack including an active layer that generates radiation, and a radiation emission side, and a conversion layer disposed on the radiation emission side of the semiconductor layer stack, wherein the conversion layer converts at least a portion of the radiation, which is emitted by the active layer, into radiation of a different wavelength, the radiation emission side of the semiconductor layer stack includes a first nanostructure, and the conversion layer is disposed in the first nanostructuring, wherein the first nanostructuring is composed of a plurality of nanorods and recesses, and the active layer covers all lateral surfaces and base surfaces of the recesses.

BRIEF DESCRIPTION OF THE DRAWINGS

FIGS. 2A to 2C each show a schematic cross-section of a further example of a semiconductor chip in our production method.

FIGS. 3A to 3D each show a schematic cross-section of a further example of a semiconductor chip in our production method.

DETAILED DESCRIPTION

Figure 1A:
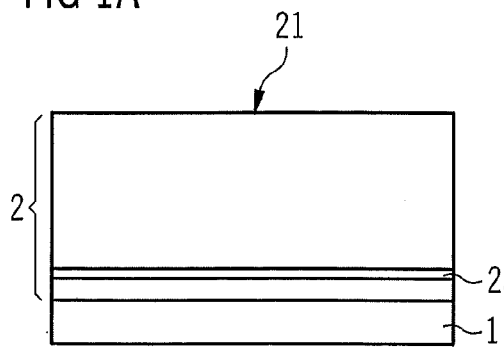
FIGS. 1A to 1D each show a schematic cross-section of a semiconductor chip in our production method.

The optoelectronic semiconductor chip may have a semiconductor layer stack which has an active layer provided to generate radiation, and a radiation emission side. Furthermore, the semiconductor chip has a conversion layer on the radiation emission side of the semiconductor layer stack and converts at least a portion of the radiation, which is emitted by the active layer, into radiation of a different wavelength. The radiation emission side of the semiconductor layer stack has a first nanostructuring. The conversion layer is disposed in the first nanostructuring.

In particular, an optoelectronic semiconductor chip is a semiconductor chip which permits conversion of electronically generated data or energies into light emission or vice versa. For example, the optoelectronic semiconductor chip is a radiation-emitting semiconductor chip.

In particular, a nanostructuring is a three-dimensional structure, i.e., a structure which is formed spatially. For example, a nanostructuring is formed by a cut-out or a trench in a layer or a layer sequence. In particular, nanostructuring is not to be understood as a mere roughening of the radiation emission side. Accordingly, a nanostructuring in terms of the application must have a larger spatial deviation from a planar surface than a mere roughening of this surface.

The conversion layer is disposed in the first nanostructuring. This implies that the conversion layer is disposed directly downstream of the radiation emission side, which means that as the emitted radiation generated by the active layer exits the semiconductor chip it passes through the conversion layer or is converted in the conversion layer into radiation of a different wavelength.

The radiation emission side of the semiconductor layer stack thus has a spatial structure, wherein cut-outs, recesses or trenches formed by the nanostructuring are filled at least in places with the conversion layer. Preferably, the recesses, cut-outs or trenches of the first nanostructuring are filled completely with material of the conversion layer.

By reason of the first nanostructuring of the semiconductor layer stack, a large-scale contact surface is produced between the conversion layer and the semiconductor layer stack. This advantageously permits a large interaction surface between the conversion layer and the semiconductor layer stack, thus producing an improved optical and thermal coupling of the conversion layer to the semiconductor layer stack. The conversion layer is thus in direct contact over a large area with the semiconductor layer stack, in particular the radiation emission side. By reason of this large surface-contact, the conversion efficiency can be advantageously increased. It is thereby possible at the same time to achieve an improved capability to control the conversion.

This type of semiconductor chip advantageously has a reduction of the scattering losses during the conversion, better color homogeneity over the angle of incidence of the radiation emitted by the active layer, good thermal bonding of the conversion layer to the semiconductor layer stack and the possibility of permitting a full conversion. A full conversion is to be understood in particular to be a radiation conversion, in which almost all of the radiation emitted by the active layer is converted in the conversion layer into radiation of a different wavelength.

Moreover, this type of semiconductor chip having an integrated conversion element permits a component formed without volume filler or a package to effect conversion. Such semiconductor chips can thus be soldered directly onto, e.g., a printed circuit board. This leads to a reduction in the costs while maintaining optimum radiation efficiency at the same time. The thermal and optical coupling of the conversion layer to the semiconductor layer stack is particularly advantageous for applications which require a high luminous density such as, e.g., projection applications, headlamps and spotlight applications.

The semiconductor layer stack, in particular the active layer, contains at least one III/V-semiconductor material, e.g., a material from the material systems $In_xGa_yAl_{1-x-y}P$, $In_xGa_yAl_{1-x-y}N$ or $In_xGa_yAl_{1-x-y}As$, in each case where $0 \le x, y \le 1$ and $x+y \le 1$. III/V-semiconductor materials are particularly suitable for generating radiation in the ultraviolet spectral range ($In_xGa_yAl_{1-x-y}N$), over the visible spectral range ($In_xGa_yAl_{1-x-y}N$, in particular for blue to green radiation, or $In_xGa_yAl_{1-x-y}P$, in particular for yellow to red radiation) to the infrared spectral range ($In_xGa_yAl_{1-x-y}As$).

The conversion layer is, e.g., a layer having a matrix material and a conversion element embedded therein and converting at least a portion of the radiation emitted by the active layer into radiation of a different wavelength. Suitable conversion elements are known and therefore not further explained. The matrix material comprises, e.g., silicone or resin. The conversion element is introduced preferably uniformly in the matrix material which means that a uniform coupling-out of radiation over the coupling-out angle and a uniform radiation conversion are permitted.

The first nanostructuring may be a plurality of nanorods. A nanorod is defined in particular as a rod-like or column-like structure which has a height greater than the lateral extension.

So-called "nanorods" are also known by the term nanowire. The nanorods can have a round, oval or rectangular cross-sectional surface.

The nanorods preferably have a uniform distribution. Provided between the individual nanorods are intermediate regions, in particular spacings, which are preferably approximately equal in size in each case.

The nanorods are formed in particular in the semiconductor layer stack, which means that the nanorods comprise material of the semiconductor layer stack. A matrix-like arrangement of nanorods in a top view of the semiconductor chip is advantageous.

The conversion layer may fill the first nanostructuring such that a planar surface is formed. In this case, the conversion layer completely fills recesses, intermediate spaces, cut-outs or trenches of the first nanostructuring of the semiconductor layer stack, which means that the semiconductor layer stack in combination with the conversion layer is planar in formation. In particular, the side of the conversion layer facing away from the semiconductor layer stack and the radiation emission side of the semiconductor layer stack merge seamlessly into one another.

The conversion layer may be formed as a second nanostructuring which comprises a plurality of nanorods. The nanorods of the first nanostructuring and the nanorods of the second nanostructuring are disposed preferably in a lateral direction next to one another. The nanorods of the second nanostructuring are thereby disposed in the intermediate spaces of the nanorods of the first structuring. Preferably, there is no spacing between the first nanostructuring and the second nanostructuring, which means that they directly adjoin one another.

The first nanostructuring and the second nanostructuring may be disposed with respect to each other such that they engage one another. If the first and the second nanostructuring are thus formed as nanorods, the nanorods of the first nanostructuring and the rods of the second nanostructuring are offset with respect to each other, which means that the nanorods of the first nanostructuring are disposed in the intermediate spaces of the nanorods of the second nanostructuring, and vice versa.

The first nanostructuring and the second nanostructuring may be formed in a comb-like manner with respect to each other. In particular, the first and the second nanostructuring engage one another in comb-like manner.

The first nanostructuring and the second nanostructuring may adjoin one another such that, by having a layer sequence, they form a plurality of first layers and a plurality of second layers in a lateral direction.

"In a lateral direction" means in particular perpendicular to the main radiation direction of the semiconductor chip. In particular, the semiconductor chip is preferably a surface-emitting semiconductor chip, whose main radiation direction is directed perpendicularly with respect to the lateral extension of the layers of the semiconductor layer stack. In this case, "in a lateral direction" thus means perpendicularly with respect to the extension plane of the layers of the semiconductor layer stack. In particular, "in a lateral direction" means perpendicular to a growth direction of the layers of the semiconductor layer stack.

The conversion layer may be disposed in addition on the first nanostructuring. In this case, the conversion layer may thus not only be disposed in the recesses, cut-outs or trenches of the first nanostructuring and fills same completely, but also may protrude beyond these recesses of the first nanostructuring. In this case, the conversion layer can be divided, e.g., into two different regions. In the first region, the conversion layer is formed in a structured manner, preferably as nanorods. However, in the second region the conversion layer is applied over the whole surface of the semiconductor layer stack. Therefore, no structuring is present in the second region.

The first nanostructuring and/or the second nanostructuring each may have a height of 100 nm to 1 μm. The height of the nanorods of the first and second nanostructuring is preferably almost identical. In a particularly preferred manner, the height of the first nanostructuring corresponds to the height of the second nanostructuring, thus permitting a seamless transition between the conversion layer and the semiconductor layer stack.

The nanorods thereby have a height in an order of magnitude of a penetration depth of the radiation, which is emitted by the active layer, into the conversion layer. In particular, "penetration depth" is to be understood to be the length, by which an optical wave penetrates into another, in particular less refractive, material, although the light beam is actually totally reflected. The penetration depth is thereby dependent upon the angle of incidence of the radiation upon the boundary surface between the conversion layer and the semiconductor layer stack.

The active layer of the semiconductor layer stack may be formed at least partially in the region of the first nanostructuring. Alternatively, the active layer can be formed in the region of the semiconductor layer stack which does not have a first nanostructuring.

In the case of the arrangement of the active layer in the region of the first nanostructuring, e.g., the active layer is formed along the individual nanostructures. If the first nanostructuring is thus composed of a plurality of nanorods and recesses, the active layer is formed, e.g., in each case along the lateral surfaces and the base surface of the recesses and surrounds them in each case in one piece. For example, the active layer encases the nanorods. In addition, material of the semiconductor layer stack can thereby be disposed between the recesses of the first nanostructuring and the active layer.

In other words, the active layer can be formed by individual regions approximately in the form of a peripheral surface of a half cylinder or a half truncated cone, bisected in particular perpendicularly with respect to a longitudinal axis of the cylinder or truncated cone. It is possible for this active layer to be formed, as seen in cross-section, in a similar manner to a rectangular saw-tooth pattern. In this case, it is likewise possible for the active layer to be formed not by individual, separate regions but rather by a contiguous layer.

The conversion layer and the semiconductor layer stack may be coupled to one another in an optical and thermal manner. This type of coupling is made possible, e.g., by the selection of the material of the semiconductor layer stack and the conversion layer. Optical coupling is effected, e.g., by similar or identical refractive indices of the materials. For example, the refractive index of the material of the conversion layer and of the material of the semiconductor layer stack is approximately 2.4.

The semiconductor chip may be a thin-film chip. A thin-film chip is considered to be a semiconductor chip, during production of which the growth substrate, on which the semiconductor layer stack is grown epitaxially, is preferably completely detached. The thin-film chip can thereby have, e.g., a carrier substrate for mechanical stabilization of the semiconductor layers of the semiconductor layer stack.

The semiconductor chip may be a radiation-emitting semiconductor chip, in particular an LED, preferably a thin-film LED.

The conversion layer may comprise a highly refractive material. This means that the material of the conversion layer has a refractive index greater than the refractive index of the material of the semiconductor layer stack. For example, the refractive index of the conversion layer in a GaN-based semiconductor layer stack is higher than 2.4.

The second nanostructuring can thereby be formed as a vertical layer sequence, as embedded conversion particles in the highly refractive material or as embedded, highly refractive conversion particles.

In the case of GaN-semiconductor chips, e.g., $TiO_2$ which has a refractive index of approximately 2.9 is used as a possible highly refractive material. For example, when the conversion particle has a refractive index of 1.8, it is possible to achieve an average refractive index of the conversion layer close to 2.4 by virtue of a suitably selected volume ratio of the materials of the conversion layer.

In the case of semiconductor chips which have a structured conversion layer with a highly refractive material and at the same time preferably structure sizes in the region of less than the radiation wavelength emitted by the active layer, penetration of the light, which is emitted by the active layer, into the conversion layer is improved.

We also provide a method for the production of an optoelectronic semiconductor chip comprising the steps of:
providing a growth substrate,
growing onto the growth substrate a semiconductor layer stack which comprises an active layer and a radiation emission side,
forming a first nanostructuring on the radiation emission side, and
introducing a conversion layer into the first nanostructuring.

The features stated in conjunction with the optoelectronic semiconductor chip also apply to the method and vice versa.

In the case of the method, the conversion layer is thus applied only after epitaxial growth of the semiconductor layer stack. This permits an improved controllability of the conversion.

By introducing the conversion layer into the nanostructuring of the semiconductor layer stack, an enlarged boundary surface is created between the conversion layer and the semiconductor layer stack, thus permitting a larger interaction surface of the conversion layer with the semiconductor layer stack. The first nanostructuring is formed in particular as a recess, trench, cut-outs or the like, into which the conversion layer is introduced.

The conversion layer can thereby be introduced into the first nanostructuring of the semiconductor material such that the height of the cut-outs, recesses or the like of the first nanostructuring is equal to the height of the conversion layer. In this case, the conversion layer fills the recesses of the first nanostructuring completely and does not, however, protrude beyond them.

Alternatively, the conversion layer can be disposed in addition on the nanostructuring of the semiconductor layer stack, which means that the conversion layer protrudes beyond the nanostructuring of the semiconductor layer stack. In this case, the conversion layer is applied to the whole surface above the first nanostructuring of the semiconductor layer stack.

After the conversion layer has been applied to the semiconductor layer stack, the growth substrate can be separated or completely removed from the semiconductor layer stack. In particular, the side of the semiconductor layer stack, on which the growth substrate was disposed, is the side of the semiconductor chip opposite to the radiation emission side.

Growing the semiconductor layer stack and forming the first nanostructuring may comprise the steps of:

growing first layers of the semiconductor layer stack on to the whole surface of the growth substrate, and growing structured second layers of the semiconductor layer stack by means of a mask layer.

The first nanostructuring of the semiconductor layer stack can thus be produced by two different methods. On the one hand, the semiconductor layer stack can be grown on the whole surface of the growth substrate and then structured. Alternatively, a non-structured part of the semiconductor layer stack can be grown on the whole surface and then the structured region of the semiconductor layer stack can be grown to be directly structured by, e.g., a mask layer, which means that subsequent structuring is not required.

A conversion element of the conversion layer may be introduced into the first nanostructuring and then a matrix material of the conversion layer may be added into the first nanostructuring. Therefore, first, the conversion element, e.g., conversion particles, is/are introduced into the recesses of the first nanostructuring, wherein these conversion particles then have the matrix material of the conversion layer cast around them.

Alternatively, the conversion layer can be applied by, e.g., laser beam evaporation. In this case, the matrix material and the conversion element contained therein are applied together into the recesses of the first nanostructuring and onto the first nanostructuring. Such methods are also known by the term PLD-method (PLD: pulsed laser deposition).

The size of the first nanostructuring may be formed such that it is approximately in the range of the penetration depth of the radiation, which is emitted by the active layer, into the conversion. As a result, the conversion efficiency can be optimized over a surface which is as large as possible.

Further advantages will be apparent from examples described hereinafter in conjunction with FIGS. 1 to 6.

Like parts, or parts acting in an identical manner, are provided with the same reference numerals in each case in the figures. The illustrated parts and the size ratios of the parts with respect to each other are fundamentally not to be regarded as being to scale. Rather, individual parts such as, e.g., layers, structures, components and regions, may be illustrated excessively thick or large for better clarity and/or for ease of understanding.

FIGS. 1A to 1D illustrate semiconductor chips 10 at various stages in our production method.

FIG. 1A illustrates a semiconductor layer stack 2 which has been grown onto a growth substrate 1. The semiconductor layer stack 2 is disposed on the growth substrate 1. The semiconductor layer stack 2 has a radiation emission side 21 disposed opposite to the growth substrate 1. Moreover, the semiconductor layer stack 2 has an active layer 2a that generates electromagnetic radiation during operation of the semiconductor chip. The electromagnetic radiation generated in the active layer 2a preferably exits the semiconductor chip for the most part via the radiation emission side 21.

The layers of the semiconductor layer stack disposed between the active layer 2a and the growth substrate 1 are preferably p-doped. For example, these layers comprise p-GaN. The layers of the semiconductor layer stack 2 disposed on the side of the active layer 2a opposite to the growth substrate 1 are preferably n-doped, e.g., n-GaN.

Figure 1B:
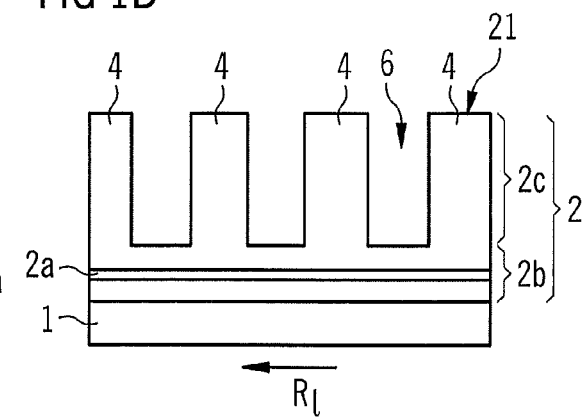

In the next method step, as illustrated in FIG. 1B, the semiconductor layer stack is structured from the n-side. In particular, recesses 6 are formed in the semiconductor layer stack from the radiation emission side 21 in the direction towards the active layer 2a. A first nanostructuring 4 is thus produced which comprises a plurality of nanorods. The nanorods 4 are separated from one another by the recesses 6. Preferably, the nanorods 4 are substantially identical in height.

The recesses 6 in the n-side of the semiconductor layer stack 2 preferably do not extend through the active layer 2a. The semiconductor layer stack 2 is thus composed of two regions 2b, 2c. The first region 2b comprises semiconductor layers disposed over the whole surface and which comprise the active layer 2, wherein the active layer is formed over the whole surface. The second region 2c comprises a plurality of semiconductor layers which have a nanostructuring, i.e., are formed in a structured manner. Formed in the second region 2c is therefore a layer sequence which comprises the nanorods 4 and recesses 6, wherein in each case one recess adjoins one nanorod 4 so that nanorods 4 and recesses 6 alternate. The layer sequence is thereby disposed in a lateral direction $R_1$. "In a lateral direction $R_1$" means in particular along the extension of the growth substrate and thus also along the extensions of the semiconductor layers of the semiconductor layer stack. The layer sequence is thus disposed perpendicularly with respect to the main radiation direction or perpendicularly with respect to the direction of growth of the layers of the semiconductor layer stack onto the growth substrate.

The nanorods 4 of the first nanostructuring are thereby adapted in terms of their size such that their size is in the range of or greater than the wavelength of the radiation emitted by the active layer. The recesses 6 likewise have this order of magnitude. For example, the nanorods are round or rectangular GaN-columns with diameters of 10 nm to 200 nm. The recesses thereby have diameters of several 10 nm to 200 nm. The height of the structures, i.e., of the nanorods and the recesses, is several 100 nm to several μm.

The first nanostructuring can be produced, e.g., by virtue of the fact that the semiconductor layers of the semiconductor layer stack are grown in the region 2d over the whole surface and are then structured, e.g., by a laser structuring method. The recesses 6 can thus be produced in the semiconductor layers which are formed originally over the whole surface.

Alternatively, production of the first nanostructuring can include that first the layers are grown in the first region 2b onto the whole surface of the growth substrate and then directly structured layers are grown in the region 2c. Structured growth can be accomplished, e.g., by a mask layer.

For the purposes of electrical contacting, an n-contacting is disposed on a large area of the n-side of the semiconductor layer stack (not illustrated). The p-contacting can thereby be effected by a suitable reforming of the nanorods, e.g., by so-called "core/shell" layers, which are known and therefore not explained in greater detail. By reason of these core/shell layers, a large surface is also available in the case of the p-contacting. A structure which is optimum in terms of current spreading is achieved in particular when the n-doping and p-doping of the semiconductor layer stack are interchanged.

Figure 1C:
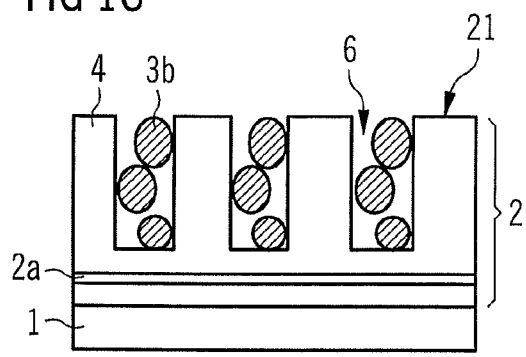

As illustrated in FIG. 1C, conversion elements 3b are subsequently introduced into the recesses 6. The conversion elements are, e.g., conversion particles that convert at least a portion of the radiation, which is emitted by the active layer 2a, into radiation of a different wavelength. The conversion elements 3b are thereby introduced separately. This means that the conversion elements 3b are not surrounded by or embedded in a matrix material. Since the recesses 6 in this example do not extend to the active layer 2a, the conversion elements 3b in the recess 6 are thus not disposed as far as to the active layer 2a. Material of the semiconductor layer stack 2 is thus disposed between the conversion elements 3b and the active layer 2a.

Figure 1D:
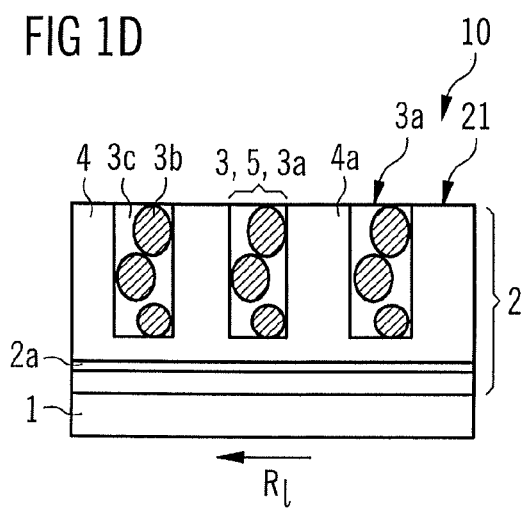

In the subsequent production step, as illustrated in FIG. 1D, a matrix material 3c is then introduced into the recesses. The matrix material 3c is preferably highly refractive, e.g., $Al_2O_3$, $TiO_2$.

Preferably, the matrix material 3c comprises a radiation-stable and temperature-stable transparent material having a refractive index of >1.5.

The matrix material 3c is thereby introduced into the recesses 6 of the semiconductor layer stack 2 such that the matrix material completely fills these recesses 6. Therefore, the matrix material 3c thus terminates the radiation emission surface 21 of the semiconductor layer stack 2 in a planar manner, in particular a planar surface of the radiation emission side can thus be produced. In particular, the matrix material 3c is not disposed on the radiation emission side 21 of the semiconductor layer stack 2.

The conversion element 3b and the matrix material 3c together form the conversion layer 3. Therefore, disposed in the region of the first nanostructuring 4 of the semiconductor layer stack 2 are regions which comprise the conversion layer 3 and regions which comprise merely material of the semiconductor layer stack, i.e., in this case the nanorods 4.

By reason of the fact that the conversion layer 3 is introduced in merely the recesses 6 of the first nanostructuring 4 of the semiconductor layer stack 2, a conversion layer 3 is produced which is formed as a second nanostructuring 5. The second nanostructuring 5 thereby comprises a plurality of nanorods. The first nanostructuring 4 and the second nanostructuring 5 thereby engage one another. In particular, the first nanostructuring 4 and the second nanostructuring 5 are formed in a comb-like manner.

A vertical layer sequence having directly adjoining first nanostructurings 4 and second nanostructurings 5 is thus formed in the second region of the semiconductor layer stack 2. The layer sequence has in particular a plurality of first layers 3a of the first nanostructuring and a plurality of second layers 4a of the second nanostructuring which are formed in the lateral direction $R_1$.

The first nanostructuring 4 and the second nanostructuring 5 have each preferably the same height, in particular 100 nm to 1 μm.

By reason of the first nanostructuring 4, a contact surface which is as large as possible is produced between the conversion layer 3 and the semiconductor layer stack 2. Therefore, an interaction surface which is as large as possible can be achieved between the conversion layer 3 and the semiconductor layer stack 2. This ensures that the conversion layer 3 and the semiconductor layer stack 2 are optically and thermally coupled in an optimum fashion. This also permits inter alia an improved capability to control the extent of conversion, since the conversion layer 3 is only applied after the process of producing the semiconductor layer stack 2.

The refractive index of the conversion layer 3 is thereby preferably adapted to the refractive index of the material of the semiconductor layer stack. This means that the refractive indices of these materials are as similar as possible or identical. For example, the refractive indices of these two materials are 2.4.

The example of FIGS. 2A to 2C illustrates an alternative method of producing a semiconductor chip. FIG. 2A thereby corresponds substantially to FIG. 1A and FIG. 2B corresponds substantially to FIG. 1B.

In contrast, the method steps of FIGS. 1C and 1D are carried out in the example of FIG. 2C at the same time. In particular, the conversion layer 3 is introduced into the first nanostructuring in one method step. This means that the conversion element and the matrix material of the conversion layer 3 are already mixed prior to application to the semiconductor layer stack 2 and are applied together to the semiconductor layer stack 2. An application such as this can be permitted, e.g., by direct deposition of the conversion layer, e.g., via pulsed laser deposition (PLD).

In the example of FIG. 2C, the conversion layer 3 is introduced in the region of the first nanostructuring 4, in particular in the recesses of the semiconductor layer stack 2. Moreover, the conversion layer is disposed in addition on the radiation emission side 21 of the semiconductor layer stack 2. The conversion layer can thus be divided into two regions. In the first region, the conversion layer is formed as a second nanostructuring 5 and therefore is disposed only in the intermediate spaces between the nanorods 4 of the first nanostructuring. In the second region, the conversion layer 3 is applied to the whole surface of the semiconductor layer stack 2. In this region, the conversion layer 3 is thus applied to the whole surface of the nanorods 4 of the semiconductor layer stack 2 and the nanorods 5 of the conversion layer 3.

For the remainder, the example of FIG. 2C corresponds to the example of FIG. 1D.

FIGS. 3A to 3D show a further example for the production of a semiconductor chip 10.

As illustrated in FIG. 3A, layers of the semiconductor layer stack 2b are epitaxially grown on the whole surface of a growth substrate 1. These layers form a first region 2b of the semiconductor layer stack. In particular, this region 2b does not have the active layer of the semiconductor layer stack.

Then, as illustrated in FIG. 3B, a second region 2c of the semiconductor layer stack is applied to the region 2b (applied to the whole surface) and is structured. After production of the nanostructuring, in particular the formation of the recesses 6 such that nanorods 4 are produced, an active layer 2a is grown which contains, e.g., InGaN multi quantum wells (MQW) which covers all lateral surfaces and the base surface of the recesses 6. Then, a p-doped layer or p-doped layers is/are deposited onto this active layer so that the active layer 2a is completely covered by the material of this layer.

To improve current spreading in the p-layers of the semiconductor layer stack, a transparent oxide such as, e.g., ITO or ZnO can then optionally be applied to the lateral surfaces (not illustrated).

The active layer 2a is thus located in the second region 2c and is not disposed merely longitudinally with respect to the growth substrate 1 but rather also extends in the main radiation direction along the lateral surfaces of the recesses 6.

Then, as illustrated in FIG. 3C, the conversion element 3b is introduced in the intermediate spaces of the first nanostructuring. This method step corresponds substantially to the method step of the example of FIG. 1C.

Then, as illustrated in FIG. 3D, the matrix material 3c is introduced into the recesses of the first nanostructuring. In particular, this method step corresponds substantially to the method step of the example of FIG. 1D.

For electrical contacting of the semiconductor chip 10, the p-contacting and the n-contacting can be effected from above, i.e., from the radiation emission side 21 (not illustrated).

Figure 4A:
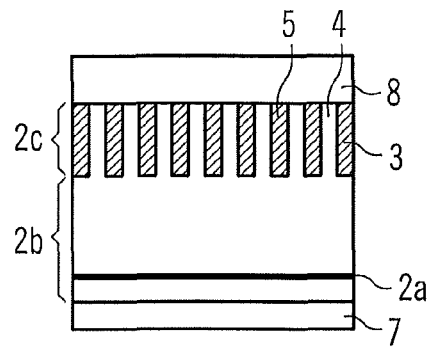
FIGS. 4A and 5A each show a schematic cross-section of a further example of a semiconductor chip.

FIG. 4A illustrates a cross-section of an example of a semiconductor chip. The first region of the semiconductor layer stack 2b and the second region of the semiconductor layer stack 2c are disposed on a mirror layer which contains, e.g., silver. The first nanostructuring 4 is formed in the second region 2c. The intermediate spaces of the first nanostructuring 4 are filled with the conversion layer 3. A cover layer 8, e.g., a silicone layer, can be disposed downstream of the radiation emission side of the semiconductor chip.

For the remainder, the example of FIG. 4A corresponds to the example of FIG. 1D.

Figure 4B:
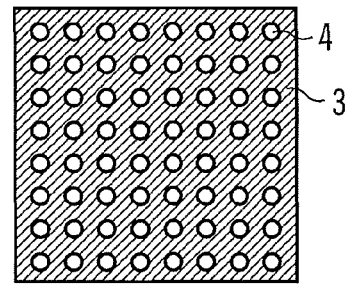
FIGS. 4B, 5B and 6A to 6C each show a schematic top view of an example of a semiconductor chip.

FIG. 4B illustrates a top view of a semiconductor chip configured in this manner. The nanorods 4 of the first nanostructuring are disposed in the manner of a matrix. The intermediate spaces between the nanorods 4 are filled with the conversion layer 3 so that a planar surface is formed. In this example, the nanorods 4 are free of material of the conversion layer 3. The optimum size of the nanorods 4 is adjusted such that it is in the range of or greater than the radiation emitted by the active layer. The first nanostructuring, in particular the nanorods 4, is penetrated by the conversion layer 3 in the range of the penetration depth. In this way, it is possible to achieve optimum thermal and optical coupling of the conversion layer to the semiconductor layer stack. An improved capability to control the extent of conversion is thus also achieved.

Figure 5A:
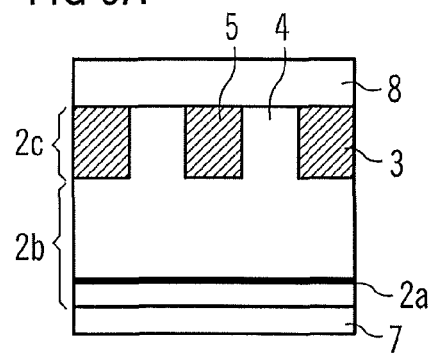

In contrast to the example of FIG. 4A, in FIG. 5A, the first nanostructuring 4 and the second nanostructuring 5 are formed differently in terms of their order of magnitude. In particular, the first and second nanostructurings 4, 5 have a larger cross-section than in the example of FIG. 4A.

For the remainder, the example of FIG. 5A corresponds to the example of FIG. 4A.

Figure 5B:
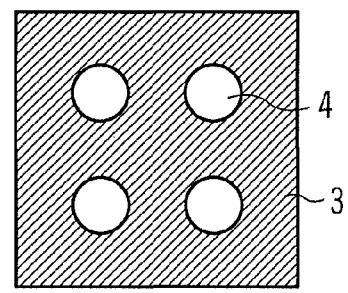

FIG. 5B illustrates a top view of a semiconductor chip in accordance with the example of FIG. 5A. The nanorods 4 of the first nanostructuring thereby have a greater spacing with respect to each other. The conversion layer 3 thus fills a larger space between the nanorods 4. Therefore, more conversion layer material 3 overall is disposed on the semiconductor layer stack.

For the remainder, the example of FIG. 5B corresponds to the example of FIG. 4B.

Figure 6A:
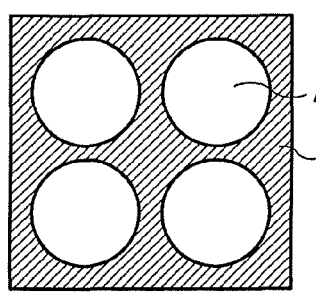
Figure 6B:
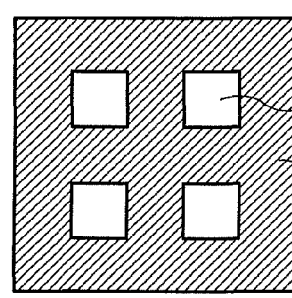
Figure 6C:
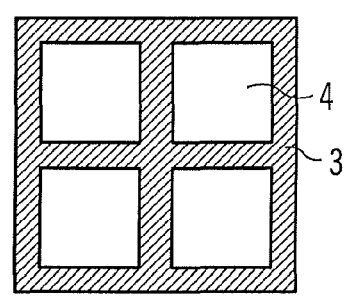

FIGS. 6A to 6C show further examples in each case of the semiconductor chip from the top side. In the example of FIG. 6A, the diameters of the nanorods 4 of the first nanostructuring are formed larger compared to the example of FIG. 5B. This reduces the size of the surface of the semiconductor chip, on which the conversion layer 3 is disposed.

In the example of FIG. 6B, the nanorods 4 are rectangular and not round in formation compared to the example of FIG. 5B. The matrix-like arrangement of the nanorods 4 is retained.

For the remainder, the example of FIG. 6B corresponds to the example of FIG. 5B.

In the example of FIG. 6C, the diameters of the nanorods 4 are larger compared to the example of FIG. 6B. Therefore, in a similar manner to the example of FIG. 6A, the size of the surface of the semiconductor layer stack, on which the conversion layer 3 is disposed, is reduced.

The size of the nanorods 4 and consequently the surface of the semiconductor layer stack covered by the conversion layer material 3 can be adjusted depending upon the desired extent of conversion.

Figure 7A:
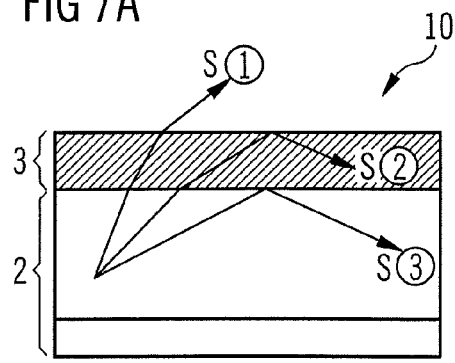
FIG. 7A shows a schematic cross-section of a conventional semiconductor chip.

FIG. 7A illustrates an example of a known semiconductor chip 10 comprising an active layer that generates radiation, in which a conversion layer 3 is applied to a semiconductor layer stack 2. The semiconductor layer stack 2 and the conversion layer 3 each do not have a nanostructuring, i.e., planar layers are formed.

In FIG. 7A, possible beam paths S1, S2, S3 of the radiation, which is emitted by the active layer, are illustrated as arrows.

In the case of a semiconductor chip which is formed in this manner, total reflection at the boundary surface between the semiconductor layer stack and the conversion layer means that a large portion of the light cannot penetrate into the conversion layer or be coupled out of the semiconductor chip, as shown by means of the beam paths S2 and S3.

This type of effect can also occur in a structured conversion layer (not illustrated), in the case where the structure size is in the range of the radiation wavelength, which is emitted by the active layer, or less, since the structuring of the optical wave cannot be resolved in this manner and the structured layer thus appears like a layer of average refractive index, also known by the term metamaterial.

Figure 7B:
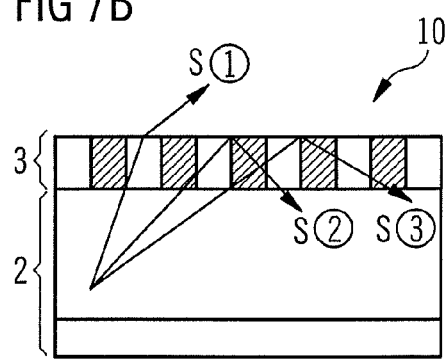
FIGS. 7B and 8A to 8E each show a schematic cross section of a further example of a semiconductor chip.

FIG. 7B illustrates an example of a semiconductor chip 10 comprising an active layer that generates radiation. In FIG. 7B, possible beam paths S1, S2, S3 of the radiation, which is emitted by the active layer, are likewise illustrated by arrows.

The semiconductor chip 10 has a semiconductor layer stack 2 formed, e.g., in accordance with the example of FIG. 2D. Disposed on the semiconductor layer stack is a conversion layer 3 having a lateral layer sequence as a structuring. In particular, regions of the conversion layer comprising a highly refractive material such as, e.g., $TiO_2$, which is free of conversion particles, and regions of the conversion layer comprising conversion particles which do not necessarily comprise a highly refractive material, alternate in a lateral direction.

As illustrated with reference to the beam paths S1, S2, S3, a larger proportion of the radiation, emitted by the active layer, can penetrate into the conversion layer. In particular, by using, in regions, a material of the conversion layer having a higher refractive index, the average refractive index of the conversion layer can be adjusted such that it corresponds approximately to that of the semiconductor material, which means that radiation can penetrate substantially unhindered into the conversion layer.

Figure 8A:
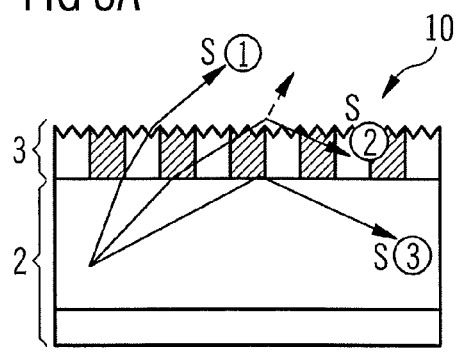

The example of FIG. 8A differs from the example of FIG. 1D in that the side of the conversion layer facing away from the semiconductor layer stack has a further structuring, in particular a roughening. As a result, the proportion of radiation which is totally reflected at the boundary surface between the conversion layer and surrounding area can be reduced, which means that the radiation coupling-out efficiency can advantageously be increased further. This is illustrated in particular by the beam paths S1, S2, S3 shown in FIG. 8A.

Figure 8B:
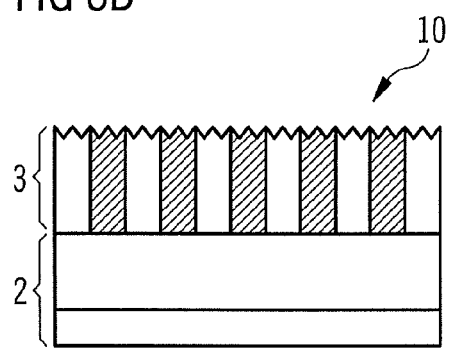

The example of FIG. 8B differs from the example of FIG. 7B in that the side of the conversion layer facing away from the semiconductor layer stack has a further structuring, in particular a roughening. As a result, the proportion of radiation which is totally reflected at the boundary surface between the conversion layer and surrounding area can be further reduced, which means that the radiation coupling-out efficiency can advantageously be increased further.

Figure 8C:
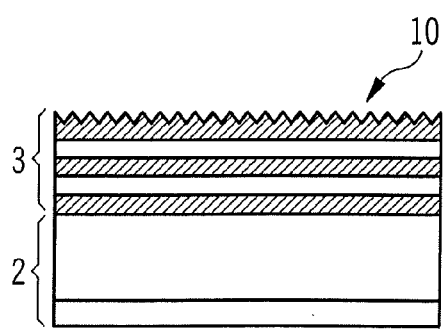

The example of FIG. 8C differs from the example of FIG. 8B in that the conversion layer has a vertical layer sequence instead of a lateral layer sequence. In particular, layers having a highly refractive material and layers having conversion particles are disposed or stacked one above the other in alternating fashion.

Figure 8D:
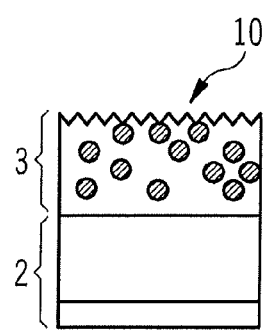
Figure 8E:
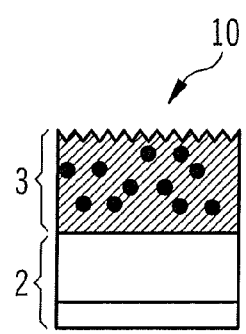

The example of FIG. 8D differs from the example of FIG. 7B in that the conversion layer 3 has conversion particles in a highly refractive material which are embedded as a structuring. The conversion layer 3 of the example of FIG. 8E has a structuring in the form of highly refractive conversion particles embedded in a material which is not necessarily highly refractive.

Our chips and methods are not limited by the description using the examples. Rather, this disclosure includes any new feature and any combination of features included in particular in any combination of features in the appended claims, even if the features or combination itself are not explicitly stated in the claims or examples.

The invention claimed is:

1. An optoelectronic semiconductor chip comprising:
a semiconductor layer stack having an active layer that generates radiation, and a radiation emission side, and
a conversion layer disposed on the radiation emission side the semiconductor layer stack, wherein
the conversion layer converts at least a portion of the radiation, which is emitted by the active layer, into radiation of a different wavelength,
the radiation emission side of the semiconductor layer stack has a first nanostructuring,
the conversion layer is only disposed in the first nanostructuring so that a top side of the nanostructuring is free of the conversion layer and so that the nanostructuring is completely filled with the conversion layer,
wherein the first nanostructuring is composed of a plurality of nanorods and recesses and the top side is a side remote from a continuous layer of the semiconductor layer stack, and
the active layer only covers all lateral surfaces and base surfaces of the recesses so that the top side of the nanostructuring is free of the active layer.

2. The semiconductor chip according to claim 1, wherein the active layer of the semiconductor layer stack is formed in the region of the first nanostructuring, and the active layer surrounds the first nanostructure in each case in one piece.

3. The semiconductor chip according to claim 1, wherein the first nanostructuring is formed as a plurality of nanorods.

4. The semiconductor chip according to claim 1, wherein the conversion layer completely fills the first nanostructuring such that a planar surface is formed.

5. The semiconductor chip according to claim 1, wherein the conversion layer is formed as a second nanostructuring which comprises a plurality of nanorods.

6. The semiconductor chip according to claim 5, wherein the first nanostructuring and the second nanostructuring are disposed with respect to each other such that they engage one another, and the first nanostructuring and the second nanostructuring are formed in a comb-like manner when viewed in a cross-sectional view.

7. The semiconductor chip according to claim 5, wherein the first nanostructuring and the second nanostructuring directly adjoin one another so that by comprising a layer sequence, they form a plurality of first layers and a plurality of second layers in a lateral direction perpendicular to a main radiation direction of the semiconductor chip and when seen in a cross-sectional view.

8. The semiconductor chip according to claim 5, wherein the first nanostructuring and the second nanostructuring each have a height of 100 nm to 1 µm.

9. The semiconductor chip according claim 1, wherein the active layer of the semiconductor layer stack is formed partially in the region of the first nanostructuring.

10. The semiconductor chip according to claim 1, wherein the conversion layer and the semiconductor layer stack are coupled in an optical and thermal manner.

11. The semiconductor chip according to claim 1, wherein the semiconductor chip is a thin-film chip.

12. A method of producing a semiconductor chip comprising:
providing a growth substrate,
growing a semiconductor layer stack onto the growth substrate which comprises an active
layer and a radiation emission side,
forming a first nanostructuring on the radiation emission side, and
introducing a conversion layer into the first nanostructuring,
wherein the semiconductor chip comprises:
a semiconductor layer stack having the active layer that generates radiation, and the radiation emission side, and
the conversion layer disposed on the radiation emission side the semiconductor layer stack, wherein
the conversion layer converts at least a portion of the radiation, which is emitted by the active layer, into radiation of a different wavelength,
the radiation emission side of the semiconductor layer stack has the first nanostructuring,
the conversion layer is only disposed in the first nanostructuring so that a top side of the nanostructuring is free of the conversion layer and so that the nanostructuring is completely filled with the conversion layer,
wherein the first nanostructuring is composed of a plurality of nanorods and recesses and the top side is a side remote from a continuous layer of the semiconductor layer stack, and
the active layer only covers all lateral surfaces and base surfaces of the recesses so that the top side of the nanostructuring is free of the active layer.

13. The method according to claim 12, wherein growing the semiconductor layer stack and forming the first nanostructuring comprise:
growing first layers of the semiconductor layer stack onto the whole surface of the growth substrate, and growing structured second layers of the semiconductor layer stack by means of a mask layer.

14. The method according to claim 12, wherein application of the conversion layer comprises:
introducing a conversion element into the first nanostructuring and then adding a matrix material into the first nanostructuring.

15. The method according to claim 12, wherein application of the conversion layer comprises:
applying the conversion layer by a laser beam evaporation procedure.

16. An optoelectronic semiconductor chip comprising:
a semiconductor layer stack comprising an active layer that generates radiation, and a radiation emission side, and
a conversion layer disposed on the radiation emission side of the semiconductor layer stack, wherein the conversion layer converts at least a portion of the radiation, which is emitted by the active layer, into radiation of a different wavelength,
the radiation emission side of the semiconductor layer stack comprises a first nanostructuring,
the conversion layer is only disposed in the first nanostructuring so that a top side of the nanostructuring is free of the conversion layer and so that the nanostructuring is completely filled with the conversion layer,
wherein the first nanostructuring is composed of a plurality of nanorods and recesses and the top side is a side remote from a continuous layer of the semiconductor layer stack,
the active layer only covers all lateral surfaces and base surfaces of the recesses so that the top side of the nanostructuring is free of the active layer, and
the semiconductor layer stack in combination with the conversion layer is planar in formation so that the top side is formed as a planar surface.

17. The semiconductor chip according to claim 16, wherein the active layer is formed by individual regions in the form of a peripheral surface of a half cylinder or a half truncated cone, as viewed in cross-section.

18. The semiconductor chip according to claim 16, wherein the active layer is formed as a contiguous layer, having a rectangular saw-tooth pattern, when viewed in a cross-sectional view.

* * * * *

UNITED STATES PATENT AND TRADEMARK OFFICE
CERTIFICATE OF CORRECTION

PATENT NO.        : 8,969,900 B2                                             Page 1 of 1
APPLICATION NO.   : 13/883346
DATED             : March 3, 2015
INVENTOR(S)       : Sabathil et al.

It is certified that error appears in the above-identified patent and that said Letters Patent is hereby corrected as shown below:

In the claims,

<u>In Column 13</u>

At line 9, please insert -- of -- before "the semiconductor".

<u>In Column 14</u>

At line 9, please insert -- of -- before "the semiconductor".

Signed and Sealed this
Third Day of November, 2015

Michelle K. Lee
*Director of the United States Patent and Trademark Office*